United States Patent
Hsieh et al.

(10) Patent No.: US 7,362,603 B2
(45) Date of Patent: Apr. 22, 2008

(54) STAGGER MEMORY CELL ARRAY

(75) Inventors: Yeou-Lang Hsieh, Taipei (TW); Ching-Kun Huang, Chupei (TW); Jeng-Dong Sheu, Longtan Township, Taoyaun County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/441,646

(22) Filed: May 25, 2006

(65) Prior Publication Data

US 2007/0272985 A1    Nov. 29, 2007

(51) Int. Cl.
*G11C 5/02* (2006.01)

(52) U.S. Cl. .......................... 365/51; 365/52

(58) Field of Classification Search ............ 365/51
See application file for complete search history.

(56) References Cited

U.S. PATENT DOCUMENTS

2005/0281098 A1* 12/2005 Sadra et al. ............... 365/194

* cited by examiner

*Primary Examiner*—Huan Hoang
*Assistant Examiner*—Jason Lappas
(74) *Attorney, Agent, or Firm*—Kirkpatrick & Lockhart Preston Gates Ellis LLP

(57) ABSTRACT

A memory device includes a first memory cell area having a first latch area where one or more electronic components are constructed for storing a value, and a first peripheral area surrounding the first latch area; and a second memory cell area being disposed adjacent to a first side of the first memory cell area, and having a second latch area where one or more electronic components are constructed for storing a value, and a second peripheral area surrounding the second latch area. One edge of the first memory cell area shifts away from its corresponding edge of the second memory cell area. Thus, the area or yield rate of the memory device can be adjusted.

20 Claims, 4 Drawing Sheets

STAGGER MEMORY CELL ARRAY

BACKGROUND

The present invention relates to integrated circuit (IC) designs, and more particularly to a stagger memory cell array.

Advance of semiconductor technology creates new challenges for IC designs. Ideally, it is desired to have an IC design that contains a high density of electronic components, while providing a good product yield rate. However, these two objectives are often difficult to achieve at the same time. For example, there are often certain design rules for an IC designer to arrange memory cells for a static random access memory (SRAM). These design rules determine not only the dimensions of the structural components of a memory cell, but also the geographical relations among the cells. Due to the constraints of the design rules, it is often difficult to reduce the size of a memory cell array. These design rules also limit the potential for the memory cell arrays to increase its yield rate.

Thus, what is needed is a scheme that allows IC designers to increase the size or yield rate of IC devices within the constraints of design rules.

SUMMARY

The present invention discloses a memory device. In one embodiment of the invention, the memory device includes a first memory cell area having a first latch area where one or more electronic components are constructed for storing a value, and a first peripheral area surrounding the first latch area; and a second memory cell area being disposed adjacent to a first side of the first memory cell area, and having a second latch area where one or more electronic components are constructed for storing a value, and a second peripheral area surrounding the second latch area. One edge of the first memory cell area shifts away from its corresponding edge of the second memory cell area. Thus, the area or yield rate of the memory device can be adjusted.

The construction and method of operation of the invention, however, together with additional objects and advantages thereof will be best understood from the following description of specific embodiments when read in connection with the accompanying drawings.

DESCRIPTION

Figure 1:
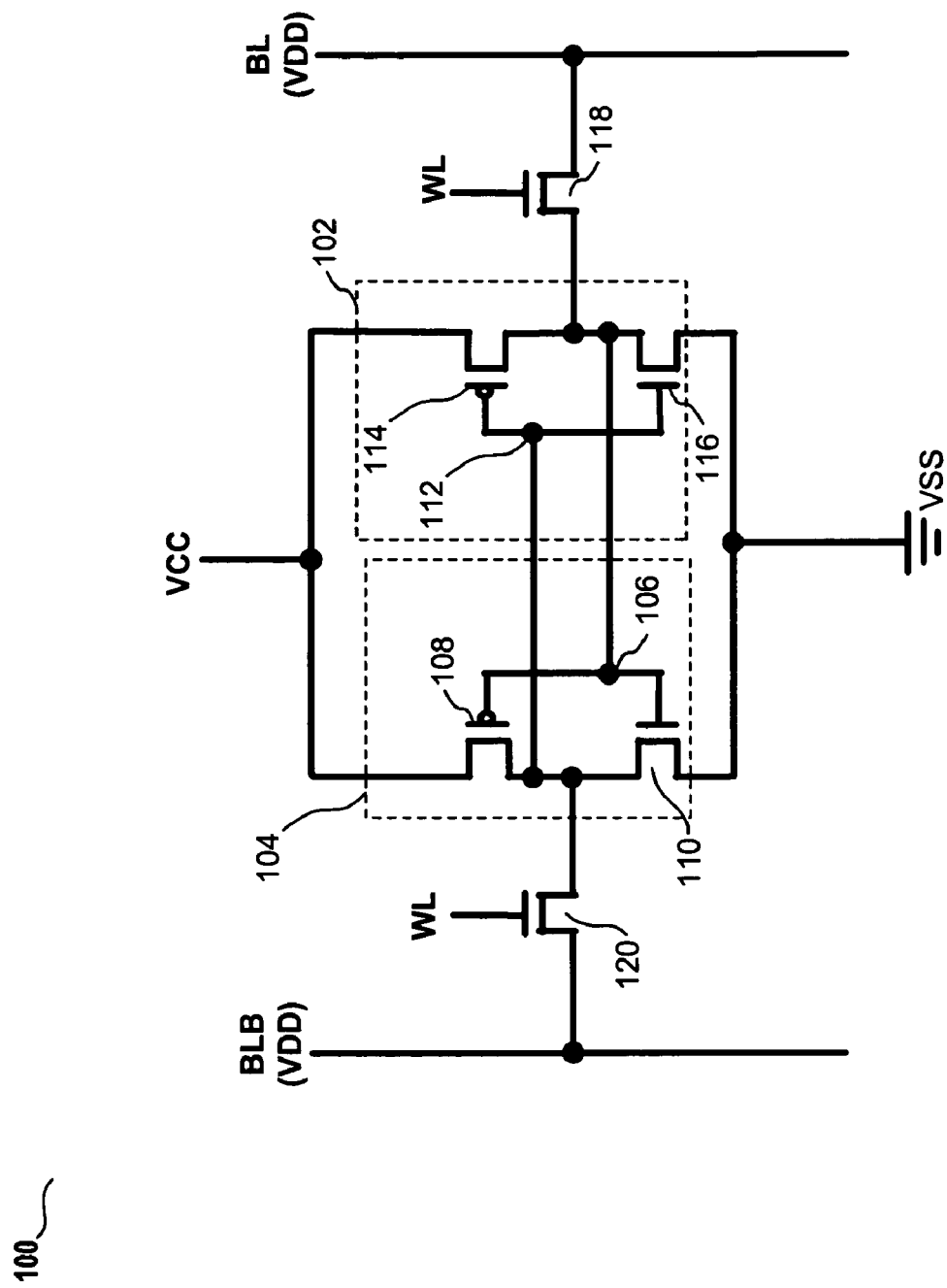
FIG. 1 illustrates a standard six-transistor (6T) SRAM cell.

Referring to FIG. 1, a circuit diagram 100 illustrates a standard 6T SRAM cell comprised of two cross-coupled inverters 102 and 104. A central storage node 106 of the inverter 102 is directly connected to the gates of a P-channel metal-oxide-semiconductor (PMOS) pull-up (PU) transistor 108 and an N-channel MOS pull-down (PD) transistor 110 of the inverter 104. Likewise, a central storage node 112 of the inverter 104 is directly connected to the gates of both a PMOS PU transistor 114 and an NMOS PD transistor 116 of the inverter 102. The central storage node 106, which is connected to the drains of the transistors 114 and 116, is written to or read from through a transfer gate transistor 118, which is connected to a bit line BL. The central storage node 112, which is connected to the drains of the transistors 108 and 110, is written to and read from through the transfer gate transistor 120, which is connected to a bit line bar BLB. The transfer gate transistors 118 and 120 are controlled by a common word line WL. The sources of the PU transistors 114 and 108 are connected to a power supply voltage VCC. The sources of the PD transistors 116 and 110 are connected to ground voltage VSS.

Figure 2:
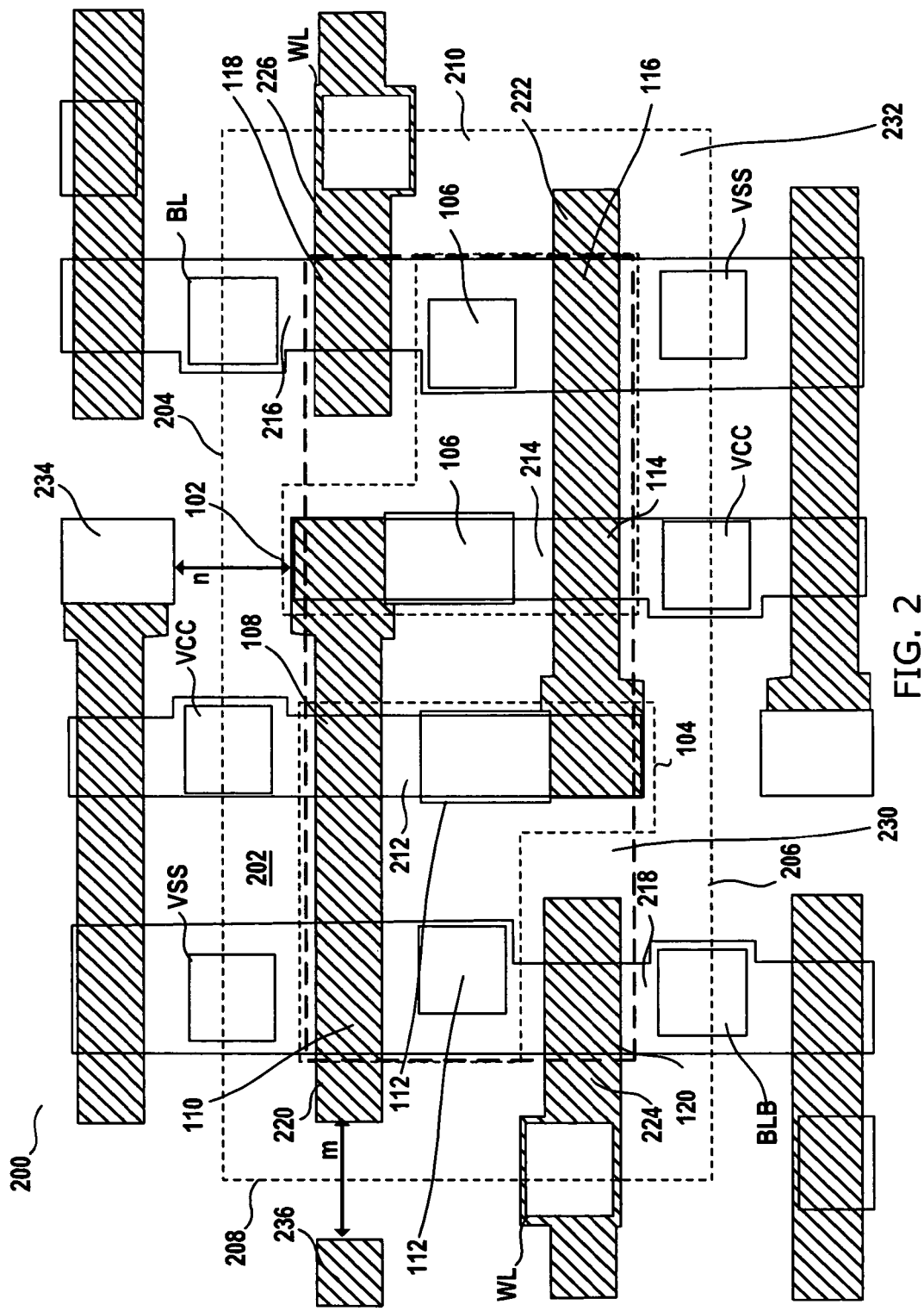
FIG. 2 illustrates a layout view of the standard 6T SRAM cell shown in FIG. 1.

FIG. 2 illustrates a layout view 200 of a standard 6T SRAM cell shown in FIG. 1. The inverter 102 contains the central storage node 106, the PU transistor 114, and the PD transistor 116. The inverter 102 is written to or read from through the transfer gate transistor 118. The inverter 104 contains the central storage node 112, the PU transistor 108, and the PD transistor 110. The inverter 104 is written to or read from through the transfer gate transistor 120. As shown, each of the six transistors is labeled at its gate. VCC, VSS, WL, BL, and BLB are labeled at the contacts at the boundary lines 204, 206, 208 and 210 of the unit cell. Therefore, each of the contacts is shared by two adjacent unit cells. Gate conductive layers 212 and 214 for the PMOS transistors run vertically. Gate conductive layers 216 and 218 for the NMOS transistors also run vertically. Doped regions 220, 222, 224, and 226 for gates run horizontally.

The part of the layout area occupied by the interconnected inverters 102 and 104 are hereinafter referred to as the latch area 230, whereas the area between the latch area 230 and the boundary lines 204, 206, 208 and 210 is hereinafter referred to as the peripheral area 232. Due to constraints of design rules, the latch area 230 needs to keep constant.

Figure 3:
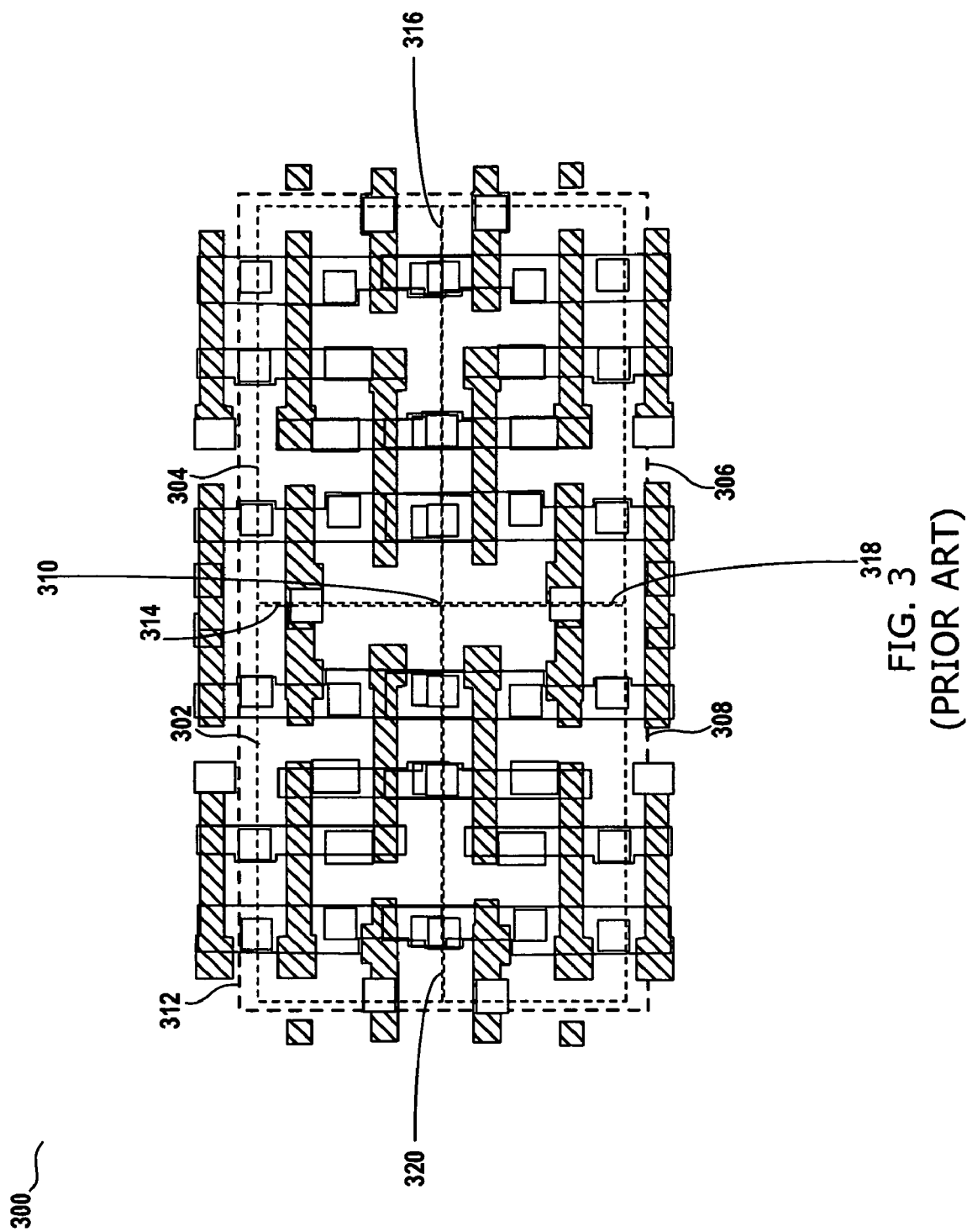
FIG. 3 illustrates a conventional layout structure of an SRAM cell array.

FIG. 3 illustrates a conventional layout structure of an SRAM cell array 300. Consider a group of four adjacent memory cell areas 302, 304, 306, and 308 that have a common corner 310. This group of four memory cell areas 302, 304, 306 and 308 constitutes a pattern 312 that is repeated in X and Y directions to form a memory cell array. Along boundaries 314 and 318, WL contacts are shared between the memory cell areas 302 and 304 and between the memory cell areas 308 and 306. Along a boundary 316, VCC, VSS, and BL are shared. Along a boundary 320, VCC, VSS, and BLB are shared. The vertical edges of the memory cell areas 302 and 308 are in alignment with each other. The vertical edges of the memory cell areas 304 and 306 are in alignment with each other. The horizontal edges of the memory cell areas 302 and 304 are in alignment with each other. The horizontal edges of the memory cell areas 306 and 308 are in alignment with each other.

Referring simultaneously to FIGS. 2 and 3, the vertical distance between two peripheral areas of two vertically adjacent memory cell areas is represented by n, and the horizontal distance between two peripheral areas of two horizontally adjacent memory cell areas is represented by m. The distance n is defined as the distance between one reference point at a top edge of the gate conductive layer 214 and its corresponding reference point at a bottom edge of the gate conductive layer 234 of its adjacent memory cell area. The distance m is defined as the distance between one reference at a left edge of the doped region 220 and its corresponding reference point at a right edge of the doped region 236 of its adjacent memory cell area. Due to certain design rules, the distances m and n need to remain constant.

As discussed above, the latch area 230 cannot be reduced. In order to reduce the area of the SRAM cell array 200, only the peripheral area 232 can be reduced. However, due to constraints of design rules, the distances m and n need to be set above a predefined value. This creates a challenge for designers to reduce the area or increase the yield rate of the SRAM cell array 200.

Figure 4:
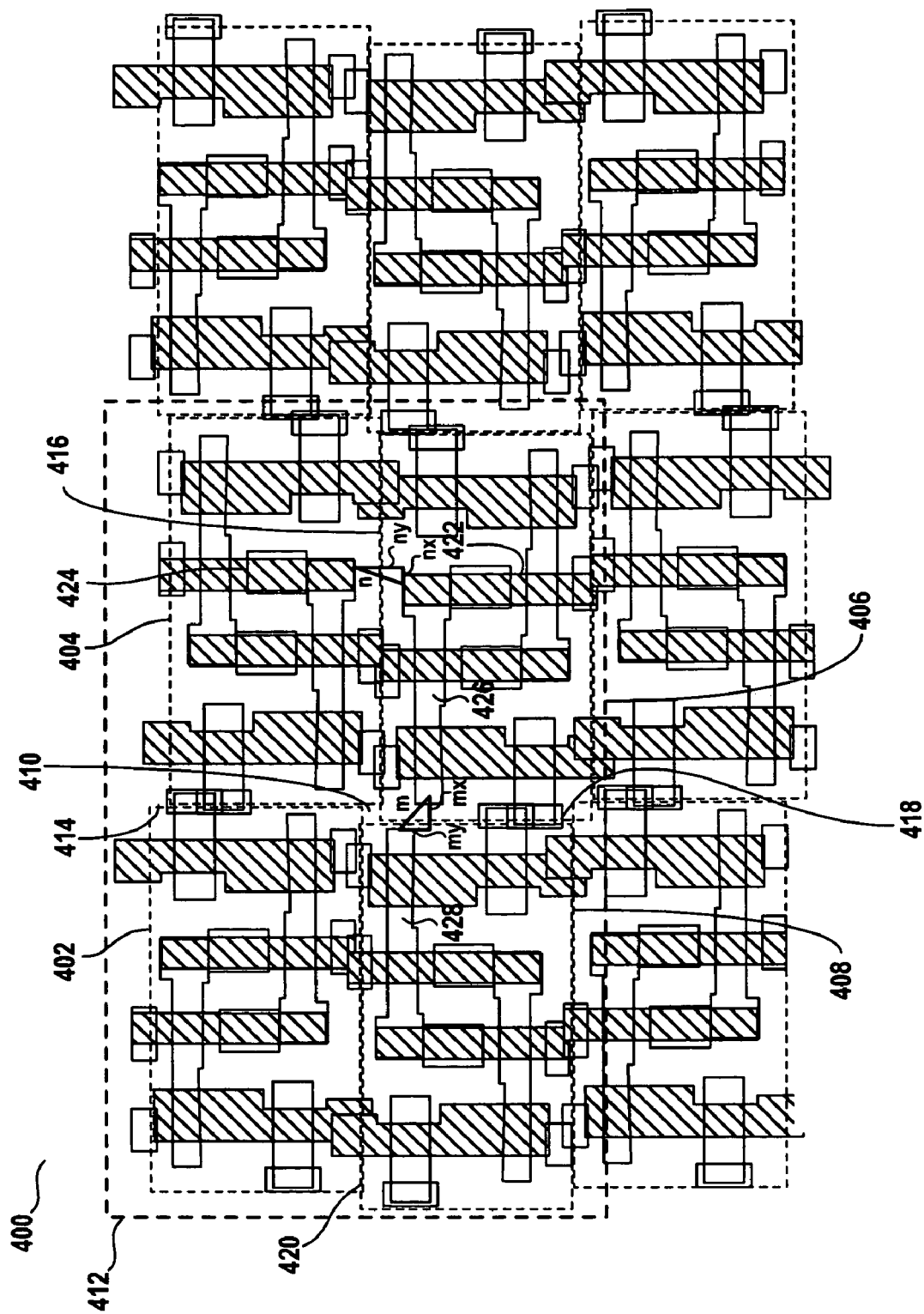
FIG. 4 illustrates a layout structure of a stagger SRAM cell array in accordance with one embodiment of the present invention.

FIG. 4 illustrates a layout structure 400 of a stagger SRAM cell array in accordance with one embodiment of the present invention. To achieve the layout structure 400, the memory cell area 302 of FIG. 3 is shifted a slight distance rightward to become a memory cell area 402, the memory cell area 304 of FIG. 3 is shifted a slight distance downward to become a memory cell area 404, the memory cell area 306 of FIG. 3 is shifted a slight distance leftward to become a memory cell area 406, and the memory cell area 308 of FIG. 3 is shifted a slight distance upward to become a memory cell area 408. This shifting also creates memory cell area boundary overlaps 414, 416, 418, and 420. A small void rectangle 410 is created at the common corner that replaces common corner 310 in FIG. 3. This group of four memory cell areas 402, 404, 406 and 408 constitutes a pattern 412 that is repeated in X and Y directions to form the stagger SRAM cell array 400.

The gate conductive layers 422 and 424 are slightly shifted across two adjacent memory cell areas 404 and 406. The symbol n represents the distance between two corresponding references points of the conductive layers 422 and 424. Due to the shifting between the memory cell areas 404 and 406, the distance n can be shown as a combination of a x-axis component $n_x$ and y-axis component $n_y$. As discussed above, the distance n of FIG. 4 needs to remain the same as the distance n of FIG. 2 in order to comply with certain design rules. Thus, the component $n_y$ would be shorter than the distance n of FIG. 2, which equal to the summation of the widths of two adjacent peripheral areas. In other words, the peripheral areas of FIG. 4 are reduced as compared to those of FIG. 2. Further, the component $n_x$ represents the shifted distance between the memory cell areas 404 and 406. Given that the distance n is a constant, the longer the component $n_x$, the shorter the component $n_y$. Thus, the shifted distance between the memory cell areas 404 and 406 determines the amount of the reduced area for the peripheral areas.

The doped regions 426 and 428 are slightly shifted across two adjacent memory cell areas 406 and 408. The symbol m represents the distance between two corresponding reference points of the doped regions 426 and 428. Due to the shifting between the memory cell areas 408 and 406, the distance m can be shown as a combination of a x-axis component $m_x$ and y-axis component $m_y$. As discussed above, the distance m of FIG. 4 needs to remain the same as the distance m of FIG. 2 in order to comply with certain design rules. Thus, the component $m_x$ would be shorter than the distance m of FIG. 2, which equals to the summation of the widths of two adjacent peripheral areas. In other words, the peripheral areas of FIG. 4 are reduced as compared to those of FIG. 2. Further, the component my represents the shifted distance between the memory cell areas 408 and 406. Given that the distance m is a constant, the longer the component $m_y$, the shorter the component $m_x$. Thus, the shifted distance between the memory cell areas 408 and 406 determines the amount of the reduced area for the peripheral areas.

The embodiment of the present invention reduces the peripheral areas, while keeping the latch area unchanged. As a result, the total area of the SRAM cell array 400 can be reduced. For example, the embodiment of the present invention can reduce the area of an SRAM device manufactured by 65 nm semiconductor processing technology by 3.0%.

In another embodiment of the present invention, the vertical distance $n_y$ of FIG. 4 remains the same as the distance n of FIG. 2, and the horizontal distance $m_x$ of FIG. 4 remains the same as the distance m of FIG. 2. Thus, the distances m and n of FIG. 4 would be longer than the distances m and n of FIG. 2. This can increase the peripheral areas, therefore the total area of the SRAM cell array. As a result, the yield rate of such SRAM device can be improved. It is noted that the SRAM cell array design in FIG. 4 can satisfy the design rules, as long as the distances m and n are no smaller than the distances m and n of FIG. 2.

The present invention proposes a stagger SRAM cell array that allows the peripheral areas to be adjusted, while keeping the latch areas unchanged. This provides at least two applications. In the first application, the distance between corresponding reference points of two adjacent memory cell areas is kept constant before and after the shifting. This application reduces the total area of a SRAM device. In another application, the vertical or horizontal distances between corresponding reference points of two adjacent memory cell areas is kept constant before and after the shifting. This application increases the total area of a SRAM device, thereby improving its yield rate.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A memory device comprising:
   a first memory cell area having a first latch area where one or more electronic components are constructed for storing a value, and a first peripheral area surrounding the first latch area;
   a second memory cell area being disposed adjacent to a first side of the first memory cell area, and having a second latch area where one or more electronic components are constructed for storing a value, and a second peripheral area surrounding the second latch area; and
   a third memory cell area disposed adjacent to a bottom side of the second memory cell area, and having a third latch area where one or more electronic components are constructed for storing a value, and a third peripheral area surrounding the third latch area,
   wherein the first memory cell area is shifted rightward by a first distance, the second memory cell area is shifted downward by a second distance, and the third memory cell area is shifted leftward by a third distance to form a stagger memory cell array, such that horizontal and vertical edges of the first, second, and third memory cell areas are not in alignment with each other.

2. The memory device of claim 1 is a six-transistor static random access memory (SRAM) device.

3. The memory device of claim 1 wherein the first and second latch areas comprise a first gate conductive and a second gate conductive layer, respectively, the second gate conductive layer shifting away from the first gate conductive layer along a direction substantially perpendicular to a longitudinal axis of the first conductive layer by a first predetermined distance.

4. The memory device of claim 3 wherein when a distance between a reference point of the first gate conductive layer and a corresponding reference point of the second gate conductive layer is set to be constant, the first predetermined distance determines the amount of reduced area for the first and second peripheral areas.

5. The memory device of claim 3 wherein when a vertical or horizontal distance between a reference point of the first gate conductive layer and a corresponding reference point of the second gate conductive layer is set to be constant, increasing the first predetermined distance increases a yield rate of the memory device.

6. The memory device of claim 1 further comprising a third memory cell area having a third latch area where one or more electronic components are constructed for storing a value, and a third peripheral area surrounding the third latch area, wherein the third memory cell area is disposed adjacent to a second side of the first memory cell area that is substantially perpendicular to the first side.

7. The memory device of claim 6 wherein the first and third latch areas comprise a first doped region and a second doped region, respectively, the second doped region shifting away from the first doped region along a direction perpendicular to a longitudinal axis of the first doped region by a second predetermined distance.

8. The memory device of claim 7 wherein when a distance between a reference point of the first doped region and a corresponding reference point of the second doped region is set to be constant, the second predetermined distance determines the amount of reduced area for the first and third peripheral areas.

9. The memory device of claim 7 wherein when a vertical or horizontal distance between a reference point of the first doped region and a corresponding reference point of the second doped region is set to be constant, increasing the second predetermined distance increases a yield rate of the memory device.

10. The memory device of claim 1 wherein the first and second latch areas remain constant notwithstanding that the first and second peripheral areas are designed in various dimensions.

11. A memory device comprising:
a first memory cell area having a first latch area where one or more electronic components are constructed for storing a value, and a first peripheral area surrounding the first latch area;
a second memory cell area being disposed adjacent to a first side of the first memory cell area, and having a second latch area where one or more electronic components are constructed for storing a value, and a second peripheral area surrounding the second latch area; and
a third memory cell area having a third latch area where one or more electronic components are constructed for storing a value, and a third peripheral area surrounding the third latch area,
wherein the third memory cell area is disposed adjacent to a bottom side of the second memory cell area that is substantially perpendicular to the first side,
wherein the first memory cell area is shifted rightward by a first distance, the second memory cell area is shifted downward by a second distance, and the third memory cell area is shifted leftward by a third distance to form a stagger memory cell array, such that horizontal and vertical edges of the first, second, and third memory cell areas are not in alignment with each other.

12. The memory device of claim 11 is a six-transistor static random access memory (SRAM) device.

13. The memory device of claim 11 wherein the first and second latch areas comprise a first gate conductive and a second gate conductive layer, respectively, the second gate conductive layer shifting away from the first gate conductive layer along a direction substantially perpendicular to a longitudinal axis of the first conductive layer by a first predetermined distance.

14. The memory device of claim 11 wherein the first and third latch areas comprise a first doped region and a second doped region, respectively, the second doped region shifting away from the first doped region along a direction perpendicular to a longitudinal axis of the first doped region by a second predetermined distance.

15. The memory device of claim 11 wherein the first, second and third latch areas remain constant notwithstanding that the first, second and third peripheral areas are designed in various dimensions.

16. A memory device comprising:
a first memory cell area having a first latch area where one or more electronic components are constructed for storing a value, and a first peripheral area surrounding the first latch area;
a second memory cell area being disposed adjacent to a first side of the first memory cell area, and having a second latch area where one or more electronic components are constructed for storing a value, and a second peripheral area surrounding the second latch area; and
a third memory cell area having a third latch area where one or more electronic components are constructed for storing a value, and a third peripheral area surrounding the third latch area,
wherein the third memory cell area is disposed adjacent to a bottom side of the second memory cell area that is substantially perpendicular to the first side,
wherein the first memory cell area is shifted rightward by a first distance, the second memory cell area is shifted downward by a second distance, and the third memory cell area is shifted leftward by a third distance to form a stagger memory cell array, such that horizontal and vertical edges of the first, second, and third memory cell areas are not in alignment with each other,
wherein the first, second and third latch areas remain constant notwithstanding that the first, second and third peripheral areas are designed in various dimensions.

17. The memory device of claim 16 is a six-transistor static random access memory (SRAM) device.

18. The memory device of claim 16 wherein the first and second latch areas comprise a first gate conductive and a second gate conductive layer, respectively, the second gate conductive layer shifting away from the first gate conductive layer along a direction substantially perpendicular to a longitudinal axis of the first conductive layer by a first predetermined distance.

19. The memory device of claim 18 wherein the first and third latch areas comprise a first doped region and a second doped region, respectively, the second doped region shifting away from the first doped region along a direction perpendicular to a longitudinal axis of the first doped region by a second predetermined distance.

20. The memory device of claim 19 wherein when a distance between a reference point of the first doped region and a corresponding reference point of the second doped region and a distance between a reference point of the first doped region and a corresponding reference point of the second doped region are set to be constant, the first and second predetermined distances determine the amount of reduced area for the first, second and third peripheral areas.

* * * * *